United States Patent
Buxo et al.

[11] Patent Number: 5,892,379
[45] Date of Patent: Apr. 6, 1999

[54] TRANSISTOR PROTECTION CIRCUIT AND METHOD

[75] Inventors: Juan Buxo, Mesa; Andreas A. Wild, Scottsdale; Gary H. Loechelt; Thomas E. Zirkle, both of Tempe; E. James Prendergast; Patrice M. Parris, both of Phoenix, all of Ariz.

[73] Assignee: Motorola, Inc., Schaumburg, Ill.

[21] Appl. No.: 867,661

[22] Filed: Jun. 2, 1997

[51] Int. Cl.[6] .......................... H03B 1/00; H03K 17/687
[52] U.S. Cl. .......................... 327/112; 327/427; 327/327
[58] Field of Search .................................. 327/108, 112, 327/427, 434, 309, 327, 328, 541

[56] References Cited

U.S. PATENT DOCUMENTS

| | | | |
|---|---|---|---|
| 3,947,727 | 3/1976 | Stewart | 317/31 |
| 4,508,978 | 4/1985 | Reddy | 307/482 |
| 4,678,950 | 7/1987 | Mitake | 307/550 |
| 5,064,453 | 11/1991 | Pedersen | 327/112 |

*Primary Examiner*—Toan Tran
*Assistant Examiner*—Hai L. Nguyen
*Attorney, Agent, or Firm*—Robert D. Atkins; Rennie William Dover

[57] ABSTRACT

A circuit and method protect a transistor (68, 70) from damage when controlling an input signal ($V_{PROG}$) that exceeds a gate to channel stress voltage of the transistor. A small, low current protection transistor (64, 66) is serially coupled to the gate electrode of the transistor being protected. The gate of the protection transistor is biased to a voltage ($V_P$, $V_N$) of lower magnitude than the input signal to limit the voltage applied to the gate of the protected transistor to a value within the stress voltage of the protected transistor.

16 Claims, 2 Drawing Sheets

TRANSISTOR PROTECTION CIRCUIT AND METHOD

BACKGROUND OF THE INVENTION

The present invention relates in general to integrated circuits, and more particularly to the protection of transistors that control signals whose voltage exceeds the transistors' breakdown potential.

Wireless communications systems are presently using digital techniques to increase functionality and noise immunity while reducing cost. For example, cellular telephones and pagers receive radio frequency carrier signals modulated with digital data. A digital signal processor (DSP) receives the digital data from a demodulator and executes a preprogrammed software algorithm to convert the data to audio and display signals.

Portable wireless communications devices typically operate from a low voltage battery, e.g., 3.0 volts. However, communication between integrated circuits often is based on 5.0 volt logic swings in order to improve noise immunity for data transfers. Moreover, the software programs to operate the DSP are typically stored in a nonvolatile memory circuit which uses programming signals as high as 18.0 volts to program the memory cells. The higher voltages typically are generated with charge pumps.

Such integrated circuits are fabricated on a low voltage transistor process because the resulting die is smaller and consumes less power for a given operating speed. However, the low voltage transistors are susceptible to breakdown when controlling the higher voltage signals.

Many prior art systems control the high voltages by fabricating integrated circuits on a high voltage transistor process whose devices have breakdowns exceeding the high voltage signals being controlled. However, such integrated circuits have larger die areas and lower speeds than circuits built on a low voltage process. Other prior art circuits add process steps to produce different gate oxide thicknesses to fabricate both low and high voltage transistors on the same die. However, the increase in processing steps adds to the cost of the integrated circuit, especially because high voltage devices are needed in relatively few portions of the circuit.

Still other prior art circuits use cascoded drivers to increase the voltage handling capability of high voltage stages implemented with low voltage transistors. A cascoded driver comprises two transistors with serial drain to source connections such that both transistors pass the full load current. The cascode configuration results in only a portion of the high voltage being applied to each transistor, but each transistor must be large enough to handle the full load current. For drivers supplying high load currents, two large transistors are needed to implement the cascode configuration, which increases die area and cost.

Hence, there is a need for an improved circuit and method of controlling high voltage signals with small, low voltage transistors, thereby reducing die size and cost and improving low voltage performance.

DETAILED DESCRIPTION OF THE DRAWINGS

Figure 1:
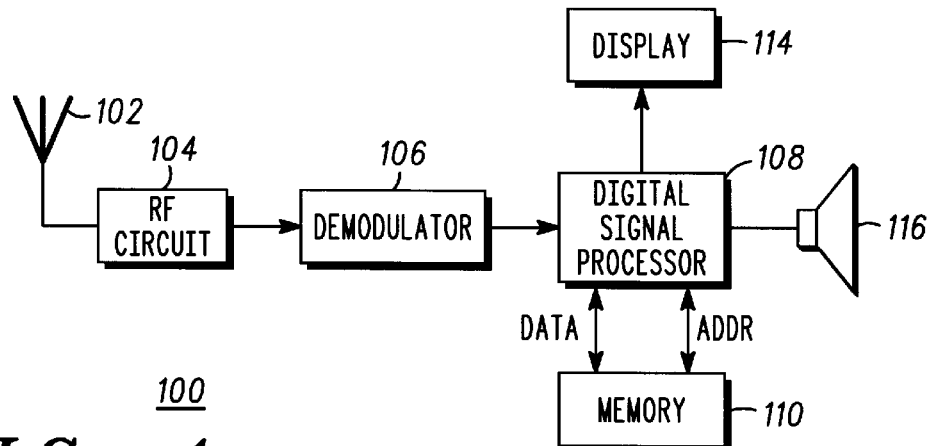
FIG. 1 is a block diagram of a wireless communications device.

FIG. 1 is a block diagram of a wireless communications device 100 such as a cellular telephone, two-way radio or pager. A receiver circuit in communications device 100 includes an antenna 102, a radio frequency (RF) circuit 104 and a demodulator 106. Antenna 102 receives a transmitted RF carrier signal modulated with digital information. RF circuit 104 amplifies the RF carrier signal and converts the frequency down to an intermediate frequency (IF) signal which is applied to an input of demodulator 106. Demodulator 106 extracts the digital information from the IF signal to produce baseband digital data which is applied to an input of a digital signal processor (DSP) circuit 108.

DSP 108 operates under the control of a software program stored in a nonvolatile memory circuit 110 operating from a battery supply $V_{DD}$=3.0 volts (not shown). The software is addressed by sending an ADDR logic signal to memory circuit 110. Transfers of DATA between DSP 108 and memory circuit 110 are made using a data bus. DSP 108 produces video and control signals for driving a display device 114, such as a liquid crystal display. An audio output produces audio signals for driving a speaker 116.

Figure 2:
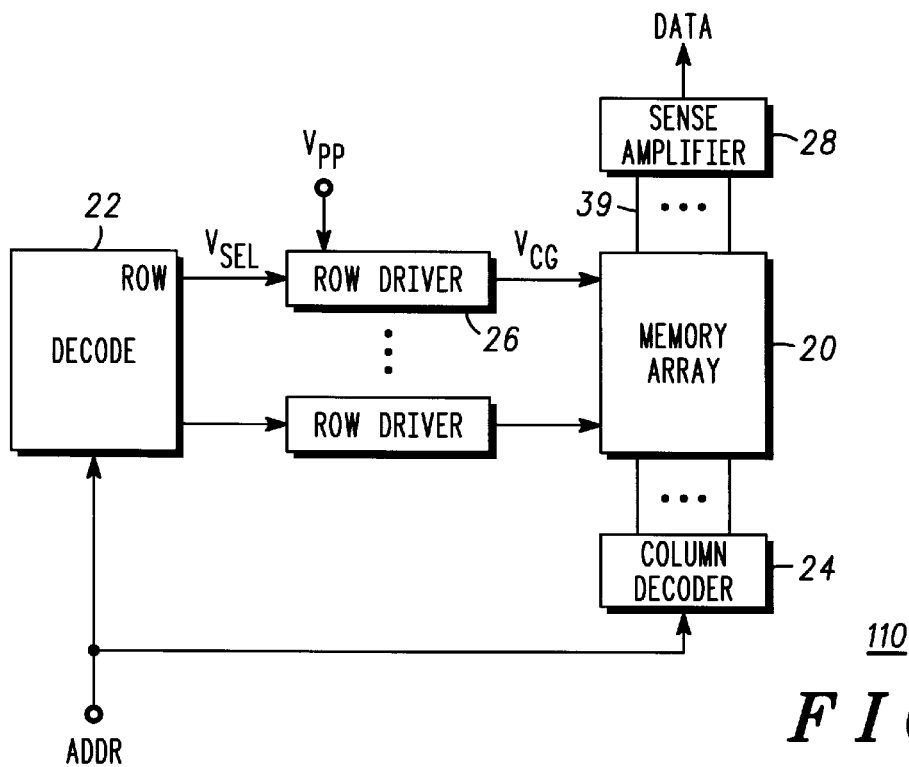
FIG. 2 is a block diagram of memory circuit.

FIG. 2 is a block diagram of memory circuit 110 including a memory array 20, a row decoder 22, a column decoder 24, a plurality of row drivers 26 and a sense amplifier 28. In the figures, elements having the same reference number perform similar functions. Memory array 20 includes a plurality of memory cells organized as a matrix of addressable rows and columns. For example, a memory array referred to as a four megabit memory and including 4,194,304 memory cells may be configured as a matrix of 2,048 rows and 2,048 columns. Numerous alternative configurations are possible, such as a matrix of 1,024 rows and 4,096 columns. Most internal logic signals in memory circuit 110 operate with logic swings between $V_{DD}$=3.0 volts and ground potential.

An individual memory cell is selected by decoding ADDR with row and column decoders 22 and 24. Row decoder 22 produces a row selection signal $V_{SEL}$ that swings between $V_{DD}$ and ground. In order to simplify the description, $V_{SEL}$ is shown as being a signal that is transferred on a single conductor. However, $V_{SEL}$ is typically a composite signal that includes row selection information as well as read and programming information for modifying the data stored in memory array 20. Therefore, $V_{SEL}$ can be transferred on a bus from row decoder 22 to row driver 26.

Row driver 26 produces a programming signal $V_{CG}$ that is applied to a memory cell to modify data stored in memory array 20. In the read mode, stored data is routed from a memory cell on an associated bitline 39 selected by column decoder 24 to an input of sense amplifier 28. $V_{PP}$=18.0 volts is a high voltage power supply voltage typically generated with a charge pump (not shown) integrated on a semiconductor die with memory circuit 110. $V_{CG}$ swings between $V_{PP}$ and ground.

To achieve high performance while controlling die size and cost, memory circuit 110 is fabricated using low voltage standard transistors. The breakdown voltage or other stress voltage of such low voltage standard transistors is a voltage which, if exceeded, results in a significant likelihood of damage or degradation to the device. For example, the breakdown potential is determined by the maximum electric field that can be applied across the gate dielectric of the device without damage. For a given voltage on the gate electrode, a thinner gate dielectric results in a higher electric field. Lower voltage transistors have thinner gate oxides and therefore can withstand less voltage between the gate dielectric and the other electrodes of the transistor. It is understood that other types of stress voltage having a lesser magnitude than the breakdown potential can also result in damage or degradation of transistors in memory circuit 110.

When a transistor is turned on to form a channel to enable a drain to source conduction path, an electric field resulting from a potential difference between the gate and channel is developed entirely across the gate dielectric. However, when the transistor is turned off and the channel is removed to deactivate the conduction path, only a portion of the electric field is developed across the gate dielectric. The remaining portion is developed across a depletion region formed at the bulk surface. Hence, the transistor has a lower breakdown when switched on than when switched off. For example, in one embodiment, standard transistors have gate-to-channel breakdown potentials of nine volts when switched on and gate-to-bulk breakdown potentials of eighteen volts when switched off. The breakdown potential between other electrodes of the transistors depends on doping levels, which are set to provide breakdowns greater than eighteen volts.

Figure 3:
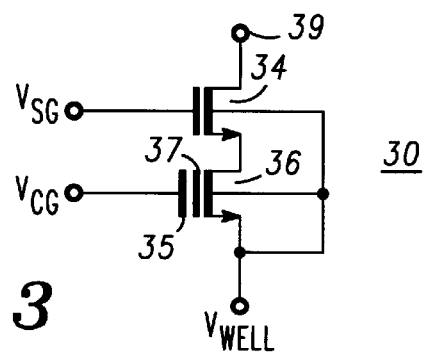
FIG. 3 is a schematic diagram of a nonvolatile memory cell.

FIG. 3 is a schematic diagram of a nonvolatile memory cell 30, including transistors 34 and 36 disposed in a p-well biased to a voltage $V_{WELL}$ typically operating at ground potential. The p-well operates as the bulk portion of transistors 34 and 36. Transistor 36 is a floating gate transistor operating as a storage element that includes a floating gate 37 which is sandwiched between dielectric layers separating a control gate 35 from the p-well or from a channel of transistor 36. To program memory cell 30, a high voltage programming signal $V_{CG}$ is applied to a control gate 35 or a programming signal $V_{BL}$ is applied to the drain electrode of transistor 36, depending on the logic value being stored. Programming signal $V_{CG}$ and $V_{BL}$ induce tunneling currents through the dielectric layers to charge floating gate 37 to a potential that controls the conduction threshold of transistor 36. Owing to the substantially zero mobility of the dielectric layers, the charge is retained on floating gate 37 even after power to memory circuit 110 is removed.

In one embodiment, programming signal $V_{BL}$ is applied to bitline 39 and coupled to the drain of transistor 36 through transistor 34 when selected by $V_{SG}$. In order to withstand a high $V_{BL}$ programming voltage, transistor 34 is configured to be of similar construction as transistor 36, with a floating gate and control gate coupled together to operate as a single nonvolatile control electrode. Read and program modes operate by respectively applying signals $V_{CG}$ and $V_{BL}$ to control gate 35 and bitline 39 as shown in Table 1 below.

TABLE 1

| MODE | $V_{CG}$ | $V_{BL}$ |
|---|---|---|
| Read | 0.0 | 3.0 |
| Program zero | 18.0 | 0.0 |
| Program one | 0.0 | 18.0 |

Transistor 34 also operates as a selection transistor which enables a conduction path in memory cell 30 in response to a control signal $V_{SG}$ for reading stored data. The drain of transistor 34 is coupled to bitline 39 for transferring DATA into and out of memory cell 30. When memory cell 30 is deselected, transistor 34 blocks conduction to reduce power drain due to leakage currents of transistor 36. In an alternative embodiment, a memory cell can be comprised of a single floating gate transistor. As a further alternative, a memory cell can be implemented with the selection transistor coupled to the source of the floating gate transistor.

Figure 4:
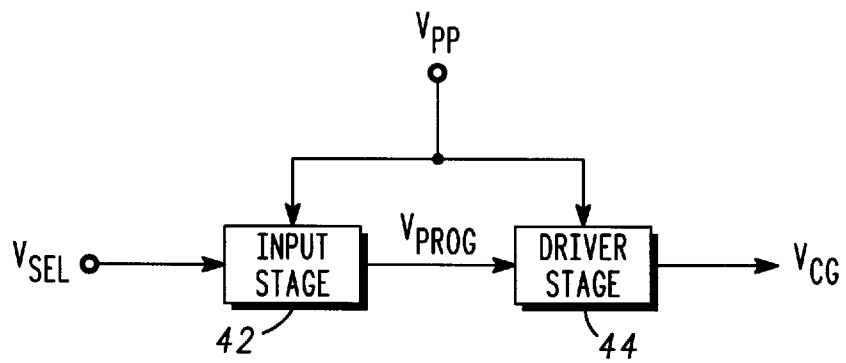
FIG. 4 is a schematic diagram of a row driver.

FIG. 4 is a schematic diagram of row driver 26 including input and driver stages 42 and 44 which are implemented with the previously described low voltage standard transistors having a nine volt breakdown potential as determined by the voltage across the gate dielectric material. Input stage 42 receives row selection/programming signal $V_{SEL}$ operating between $V_{DD}$ and ground potential, as discussed previously, and produces a programming signal $V_{PROG}$ operating between $V_{PP}$=18.0 volts and ground potential that is applied to an input of driver stage 44. Input stage 42 therefore operates as a translation circuit that converts a signal ($V_{SEL}$) whose amplitude is comparable to $V_{DD}$ to a signal ($V_{PROG}$) whose amplitude is comparable to $V_{PP}$. Input stage 42 can be configured in a variety of ways to achieve such translation, including with level shifters, bootstrap stages, cascode stages, etc., or combinations thereof.

Driver stage 44 is a high current stage configured to supply sufficient current to drive a large capacitance produced by the control gates of the memory cells in a selected row. The capacitance loading driver stage 44 is typically on the order of 2–5 picofarads, depending on the number of memory cells. Driver stage 44 produces programming signal $V_{CG}$ operating between $V_{PP}$=18.0 volts and ground potential to program a selected memory cell. Hence, operating voltage $V_{PROG}$ is greater in magnitude than the gate to channel breakdown potential of the transistors comprising input and driver stages 42 and 44 when switched on.

Figure 5:
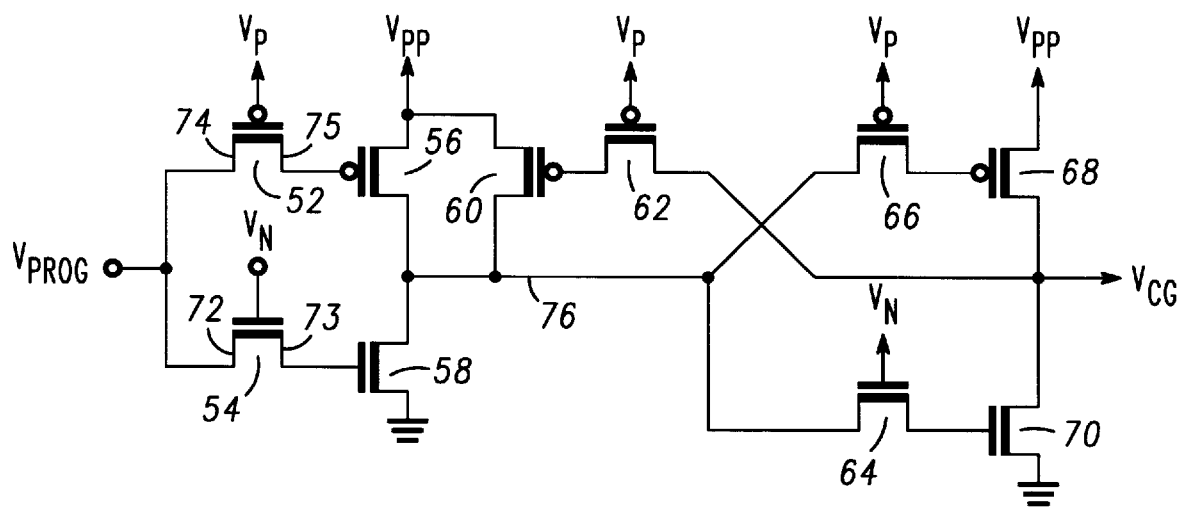
FIG. 5 is a schematic diagram of a driver stage.

FIG. 5 is a schematic diagram of driver stage 44 operating as a non-inverting buffer stage between $V_{PP}$=18.0 volts and ground potential. Driver stage 44 includes standard transistors 52–70 fabricated with a low voltage transistor process to withstand nine volts applied from gate to channel in the on state, and eighteen volts applied from gate to bulk in the off state without incurring breakdown damage. Transistors 52–70 can withstand eighteen volts applied across other electrodes without breaking down. Programming signal $V_{PROG}$, operating between $V_{PP}$=18.0 volts and ground potential, is received at an input and $V_{CG}$, operating between $V_{PP}$ and ground, is produced at an output to modify memory cell 30. $V_{PROG}$ therefore is an input signal or operating voltage applied at the drain of transistor 54 that has a value that can exceed the stress voltage or breakdown potential of transistor 58.

In one embodiment of driver stage 44, transistors 68 and 70 are large transistors capable of supplying a high current, e.g., 25.0 milliamperes, to switch a 2.0 picofarad load provided by a plurality of memory cell control gates in the row being driven by driver stage 44. Transistors 60 and 62 operate in a positive feedback mode to latch the output for improved noise immunity. Transistors 52–66 can be small transistors because the relatively small load capacitances driven by each transistor can be charged with a current of only a few microamperes. Transistors 52–66 typically consume a minimum geometric die area.

Transistors are commonly understood to have a conduction path between first and second conduction electrodes whose conduction is adjusted by a control electrode. For example, the first and second conduction electrodes typically correspond to the drain and source of a metal-oxide-semiconductor transistor and the control electrode corresponds to the gate of the transistor.

Transistors 52–54 and 62–66 are protection transistors whose conduction paths are coupled between the control electrodes of transistors 56–60 and 68–70 and have operating voltages of greater magnitude than the gate to channel breakdown potential of transistors 56–60 and 68–70. The control electrodes of the protection transistors are coupled to bias voltages of lesser magnitude than input signal $V_{PROG}$. In particular, bias voltage $V_N$=9.0 volts is set to be intermediate to the voltage of power supply $V_{PP}$ and ground, and bias voltage $V_P$=9.0 volts is set to be intermediate to the voltage of power supply $V_{PP}$ and ground. Although described as having the same potential, $V_P$ and $V_N$ may be set to different voltages without departing from the scope of the invention.

Operation of driver stage 44 is seen by assuming transistors 52–70 are fabricated to have a conduction threshold of 1.0 volt. First, refer to the operation of n-channel metal-oxide-semiconductor (NMOS) transistors 54 and 58 and p-channel metal-oxide-semiconductor (PMOS) transistors 52 and 56 when $V_{PROG}$ initially is at ground potential and makes successive ground-$V_{PP}$ and $V_{PP}$-ground transitions.

With $V_{PROG}$ initially at ground, electrode 72 of transistor 54 operates as a source to enable the conduction path of transistor 54 to pull the gate of transistor 58 to ground, thereby turning off transistor 58. As $V_{PROG}$ increases toward $V_{PP}$, the conduction path of transistor 54 is still enabled such that electrode 72 operates as a drain to pull the gate of transistor 58 and electrode 73 of transistor 54 high to switch on transistor 58. Electrode 73 operates as a source which continues to rise in potential until reaching a value of eight volts, at which point the conduction path of transistor 54 is deactivated because a further rise would bias the gate and electrode 73 below the conduction threshold of transistor 54. $V_{PROG}$ is thereby isolated from the control electrode of transistor 58. In effect, transistor 54 reduces $V_{PROG}$ by clamping the gate potential of transistor 58 at a predetermined value indicative of $V_N$ and the conduction threshold of transistor 54 and less than the magnitude of $V_{PROG}$.

Transistors 52 and 56 operate in a similar fashion. $V_{PROG}$ is applied to the conduction path of transistor 52, and the conduction path is adjusted with bias voltage $V_P$ at the gate electrode to limit the control voltage at the gate of transistor 56 to a value less than $V_{PROG}$. More specifically, when $V_{PROG}$ rises to ten volts, electrode 74 functions as a source to activate the conduction path of transistor 52 to charge the gate of transistor 56 to $V_{PP}$, thereby turning off transistor 56. Hence, transistor 56 is turned off and transistor 58 is turned on, pulling node 76 to ground.

With $V_{PROG}$=18.0 volts and the voltage at node 76 at 0.0 volts, transistors 52 and 58 are turned on. For transistor 52, the gate to source (electrode 74) potential is $V_{PP}-V_P$=9.0 volts, and the gate to drain (electrode 75) potential is $V_{PP}-V_P$=9.0 volts. For transistor 58, the gate to source potential is given by $V_N$–1.0=8.0 volts, and the gate to drain potential is given by $V_N$–1.0=8.0 volts. The respective gate to channel (source or drain) voltages do not exceed nine volts, so transistors 52 and 58 are protected from breaking down.

As $V_{PROG}$ makes a transition from $V_{PP}$ to ground potential, electrode 74 operates as a drain to pull the gate of transistor 56 and electrode 75 of transistor 52 low, thereby turning on transistor 56. Electrode 75 operates as a source which charges the gate of transistor 56 toward ground potential until reaching a magnitude of ten volts, at which point transistor 52 turns off because further transitioning would bias the gate and electrode 75 below the conduction threshold of transistor 52.

Transistors 54 and 58 operate in a similar fashion. When $V_{PROG}$ drops to eight volts, electrode 72 functions as a source to turn on transistor 54 and to pull the gate of transistor 58 to ground, thereby turning off transistor 58. Hence, transistor 58 is turned off and transistor 56 is turned on, pulling node 76 to $V_{PP}$.

With $V_{PROG}$=0.0 volts and the voltage at node 76 at $V_{PP}$=18.0 volts, transistors 54 and 56 are turned on. For transistor 54, the gate to source (electrode 72) potential is $V_N$–0.0=9.0 volts, and the gate to drain (electrode 73) potential is $V_N$–0.0=9.0 volts. For transistor 56, the gate to source potential is given by $V_P-V_{PP}$+1.0=–8.0 volts, and the gate to drain potential is given by $V_P-V_{PP}$+1.0=–8.0 volts. The gate to channel (source or drain) voltages do not exceed nine volts, so transistors 54 and 56 do not break down.

It is seen from the foregoing description that transistors 52 and 54 operate as protection transistors that respectively limit the gate to channel voltage applied to transistors 56 and 58 by clamping the gate potential of transistors 56 and 58 to a value determined by the gate bias voltage and conduction threshold of transistors 52 and 54. In a similar fashion, transistors 62, 64 and 66 respectively limit the applied gate voltage to protect transistors 60, 70 and 68.

The breakdown potential of a transistor is a stress voltage of a type that often results in immediate damage to the transistor. A skilled artisan is aware of other stress mechanisms in which stress voltages of lesser magnitude can have either an immediate or longer term detrimental effect when applied to the transistor, thereby reducing the reliability of the device. For example, one type of stress voltage which is lower in magnitude than the breakdown potential can cause charge to accumulate and be trapped within the gate dielectric. This trapped charge is not readily removed from the gate dielectric and results in an undesirable drift in the conduction threshold which can lead to transistor failure. The magnitude of such stress voltages is measurable and is typically determined by reliability testing. It should be appreciated that the principles of the present invention are equally applicable whether protecting a transistor from a breakdown potential or from another type of stress voltage whose magnitude may be less than the breakdown potential.

By reducing the gate potentials in this way, the present invention improves on the cascode protection of the prior art, which serially couples transistors to limit the drain potential rather than the gate potential. The advantage is particularly significant with respect to protecting output driver transistors in buffer stages, such as transistors 68 and 70, which are large devices designed to supply large capacitive load current. A cascode structure would perform the function of transistor 68 with two serially coupled PMOS devices, each of which passes the full load current and is therefore a large device. Similarly, the function of transistor 70 would be performed by two serially coupled NMOS devices, each of which is a large device for the same reason. Hence, a cascode structure requires a total of four large devices. The present invention accomplishes similar high voltage protection of transistors 68 and 70 using transistors 66 and 64 to reduce the gate voltages of transistors 68 and 70. Transistors 64 and 66 need not supply the full load current, and therefore may be small devices such as minimum geometry devices. Hence, the protection scheme of the present invention reduces manufacturing cost by reducing die area without using extra processing steps to fabricate transistors having different oxide thicknesses to produce high voltage and low voltage transistors on the same die.

What is claimed is:

1. An integrated circuit, comprising:
   a first transistor having a first conduction electrode coupled for receiving a first operating voltage, a second conduction electrode, and a control electrode coupled for receiving a second operating voltage;

a second transistor having a first conduction electrode coupled for receiving a third operating voltage, a second conduction electrode, and a control electrode coupled to the second conduction electrode of the first transistor;

a third transistor having a first conduction electrode coupled for receiving the first operating voltage, a second conduction electrode, and a control electrode coupled for receiving a fourth operating voltage;

a fourth transistor having a first conduction electrode coupled for receiving a fifth operating voltage, a second conduction electrode coupled to the second conduction electrode of the second transistor, and a control electrode coupled to the second conduction electrode of the third transistor;

a fifth transistor having a first conduction electrode coupled for receiving the third operating voltage, a second conduction electrode for providing an output signal, and a control electrode indirectly coupled to the second conduction electrode of the second transistor; and a sixth transistor having a first conduction electrode coupled for receiving the fifth operating voltage, a second conduction electrode coupled to the second conduction electrode of the fifth transistor, and a control electrode indirectly coupled to the second conduction electrode of the second transistor.

2. The integrated circuit of claim 1, wherein the first, second, and fifth transistors are n-channel metal-oxide-semiconductor transistors and the third, fourth, and sixth transistors are p-channel metal-oxide-semiconductor transistors.

3. The integrated circuit of claim 1, wherein the first operating voltage is greater in magnitude than a breakdown potential of the second transistor and wherein the second operating voltage has a magnitude between the first operating voltage and ground potential.

4. The integrated circuit of claim 2, wherein the stress voltage of the first transistor is determined by a voltage across the gate dielectric material when the first transistor is switched on.

5. The integrated circuit of claim 1, further comprising a memory circuit coupled to the second conduction electrode of the fifth transistor for receiving the output signal to modify a value stored in the memory circuit.

6. The integrated circuit of claim 1, further comprising:

a seventh transistor having a control electrode coupled for receiving the second operating voltage, wherein the second conduction electrode of the second transistor is coupled to the control electrode of the fifth transistor via the seventh transistor; and an eighth transistor having a control electrode coupled for receiving the fourth operating voltage, wherein the second conduction electrode of the second transistor is coupled to the control electrode of the sixth transistor via the eighth transistor.

7. The integrated circuit of claim 6, further comprising:

a ninth transistor having a first conduction electrode coupled to the second conduction electrode of the fifth transistor, a second conduction electrode, and a control electrode coupled for receiving the fourth operating voltage; and a tenth transistor having a first conduction electrode coupled for receiving the fifth operating voltage, a second conduction electrode coupled to the second conduction electrode of the second transistor, and a control electrode coupled to the second conduction electrode of the ninth transistor.

8. The integrated circuit of claim 7, wherein the seventh transistor is an n-channel metal-oxide-semiconductor transistor and the eighth, ninth, and tenth transistors are p-channel metal-oxide-semiconductor transistors.

9. A wireless communications device, comprising:

a receiver circuit having an input coupled for receiving a radio frequency carrier signal and an output for producing digital data;

a digital processing circuit for processing the digital data and producing an output signal;

a memory circuit for storing and transferring data to the digital processing circuit, where the memory circuit includes a first transistor having a first conduction electrode coupled for receiving a first operating voltage, a second conduction electrode, and a control electrode coupled for receiving a second operating voltage;

a second transistor having a first conduction electrode coupled for receiving a third operating voltage, a second conduction electrode, and a control electrode coupled to the second conduction electrode of the first transistor;

a third transistor having a first conduction electrode coupled for receiving the first operating voltage, a second conduction electrode, and a control electrode coupled for receiving a fourth operating voltagel;

a fourth transistor having a first conduction electrode coupled for receiving a fifth operating voltage, a second conduction electrode coupled to the second conduction electrode of the second transistor, and a control electrode coupled to the second conduction electrode of the third transistor;

a fifth transistor having a first conduction electrode coupled for receiving the third operating voltage, a second conduction electrode for providing an output signal, and a control electrode coupled to the second conduction electrode of the second transistor; and a sixth transistor having a first conduction electrode coupled for receiving the fifth operating voltage, a second conduction electrode coupled to the second conduction electrode of the fifth transistor, and a control electrode coupled to the second conduction electrode of the second transistor.

10. The wireless communications device of claim 9, wherein the first, second, and fifth transistors are n-channel metal-oxide-semiconductor transistors and the third, fourth, and sixth transistors are p-channel metal-oxide-semiconductor transistors.

11. The wireless communications device of claim 9, further comprising:

a seventh transistor having a control electrode coupled for receiving the second operating voltage, wherein the second conduction electrode of the second transistor is coupled to the control electrode of the fifth transistor via the seventh transistor; and an eighth transistor having a control electrode coupled for receiving the fourth operating voltage, wherein the second conduction electrode of the second transistor is coupled to the control electrode of the sixth transistor via the eighth transistor.

12. The wireless communications device of claim 11, further comprising:

a ninth transistor having a first conduction electrode coupled to the second conduction electrode of the fifth transistor, a second conduction electrode, and a control electrode coupled for receiving the fourth operating voltage; and a tenth transistor having a first conduction electrode coupled for receiving the fifth operating voltage, a second conduction electrode coupled to the second conduction electrode of the second transistor, and a control electrode coupled to the second conduction electrode of the ninth transistor.

13. The wireless communications device of claim 12, wherein the seventh transistor is an n-channel metal-oxide-semiconductor transistor and the eighth, ninth, and tenth transistors are p-channel metal-oxide-semiconductor transistors.

14. An integrated circuit, comprising:

a first transistor having a first conduction electrode coupled for receiving a first operating voltage, a second conduction electrode, and a control electrode coupled for receiving a second operating voltage;

a second transistor having a first conduction electrode coupled for receiving a third operating voltage, a second conduction electrode, and a control electrode coupled to the second conduction electrode of the first transistor;

a third transistor having a first conduction electrode coupled for receiving the first operating voltage, a second conduction electrode, and a control electrode coupled for receiving a fourth operating voltage;

a fourth transistor having a first conduction electrode coupled for receiving a fifth operating voltage, a second conduction electrode coupled to the second conduction electrode of the second transistor, and a control electrode coupled to the second conduction electrode of the third transistor;

a fifth transistor having a first conduction electrode coupled for receiving the third operating voltage, a second conduction electrode for providing an output signal, and a control electrode coupled to the second conduction electrode of the second transistor;

a sixth transistor having a first conduction electrode coupled for receiving the fifth operating voltage, a second conduction electrode coupled to the second conduction electrode of the fifth transistor, and a control electrode coupled to the second conduction electrode of the second transistor;

a seventh transistor having a first conduction electrode coupled to the second conduction electrode of the fifth transistor, a second conduction electrode, and a control electrode coupled for receiving the fourth operating voltage; and an eighth transistor having a first conduction electrode coupled for receiving the fifth operating voltage, a second conduction electrode coupled to the second conduction electrode of the second transistor, and a control electrode coupled to the second conduction electrode of the seventh transistor.

15. The integrated circuit of claim 14, further comprising:

a ninth transistor having a control electrode coupled for receiving the second operating voltage, wherein the second conduction electrode of the second transistor is coupled to the control electrode of the fifth transistor via the ninth transistor; and a tenth transistor having a control electrode coupled for receiving the fourth operating voltage, wherein the second conduction electrode of the second transistor is coupled to the control electrode of the sixth transistor via the tenth transistor.

16. The integrated circuit of claim 15, wherein the first, second, fifth, and ninth transistors are n-channel metal-oxide-semiconductor transistors and the third, fourth, sixth, seventh, eighth, and tenth transistors are p-channel metal-oxide-semiconductor transistors.

* * * * *

UNITED STATES PATENT AND TRADEMARK OFFICE
CERTIFICATE OF CORRECTION

PATENT NO. : 5,892,379  
DATED : April 6, 1999  
INVENTOR(S) : Juan Buxo et al.

Page 1 of 1

It is certified that error appears in the above-identified patent and that said Letters Patent is hereby corrected as shown below:

<u>Column 8, claim 9,</u>  
Line 28, delete "voltagel" and replace with -- voltage --.

Signed and Sealed this

Second Day of April, 2002

Attest:

JAMES E. ROGAN  
*Attesting Officer*   *Director of the United States Patent and Trademark Office*